(12) United States Patent
Nakamoto et al.

(10) Patent No.: US 7,068,548 B2
(45) Date of Patent: Jun. 27, 2006

(54) SEMICONDUCTOR INTEGRATED CIRCUIT WITH NOISE REDUCTION CIRCUIT

(75) Inventors: Hiroyuki Nakamoto, Kawasaki (JP); Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/012,145

(22) Filed: Dec. 16, 2004

(65) Prior Publication Data

US 2005/0249005 A1 Nov. 10, 2005

(30) Foreign Application Priority Data

May 7, 2004 (JP) .............................. 2004-138953

(51) Int. Cl.
*G11C 7/00* (2006.01)

(52) U.S. Cl. .................. 365/189.11; 365/206; 365/104

(58) Field of Classification Search ........... 365/189.11, 365/206, 104, 114, 51, 63, 185.27; 257/355
See application file for complete search history.

(56) References Cited

U.S. PATENT DOCUMENTS 5,796,147 A * 8/1998 Ono ........................... 257/355
5,994,741 A * 11/1999 Koizumi et al. ............. 257/355
6,208,190 B1 * 3/2001 Lukoff ......................... 327/307
6,310,487 B1 * 10/2001 Yokomizo .................... 324/769

FOREIGN PATENT DOCUMENTS

| JP | 406163823 A * | 6/1994 | .................. 257/370 |
| JP | 08-084061 | 3/1996 | |
| JP | 2000-208708 | 7/2000 | |
| JP | 2001-028423 | 1/2001 | |

* cited by examiner

*Primary Examiner*—Tuan T. Nguyen
*Assistant Examiner*—Dang Nguyen
(74) *Attorney, Agent, or Firm*—Arent Fox PLLC

(57) ABSTRACT

A semiconductor integrated circuit includes a substrate, a digital circuit formed on a triple well formed in the substrate, a first node configured to supply a well potential of the digital circuit, a second node separate from the first node, and a substrate-potential supplying circuit, formed on the substrate, having an input node to receive an input potential from the second node and an output node to supply a substrate potential to the substrate, the substrate-potential supplying circuit having no direct-current path into which a direct current substantially flows through the input node, and configured to generate at the output node an output potential following the input potential.

10 Claims, 7 Drawing Sheets

SEMICONDUCTOR INTEGRATED CIRCUIT WITH NOISE REDUCTION CIRCUIT

CROSS-REFERENCE TO RELATED APPLICATIONS

The present application is based upon and claims the benefit of priority from the prior Japanese Patent Application No. 2004-138953 filed on May 7, 2004, with the Japanese Patent Office, the entire contents of which are incorporated herein by reference.

BACKGROUND OF THE INVENTION

1. Field of the Invention

The present invention generally relates to semiconductor integrated circuits, and particularly relates to a semiconductor integrated circuit provided with a noise reduction circuit for reducing the noise of a substrate potential.

2. Description of the Related Art

FIGS. 1A and 1B are illustrative drawings showing examples of the structure of a semiconductor integrated circuit using the twin-well/triple-well process in a P-type substrate. FIG. 1A shows a twin-well structure, and FIG. 1B shows a triple-well structure. An NMOS transistor formed on a P-type substrate 10 includes a source 11 and a drain 12 made of n+ material, a gate 13 made of polysilicon, and a back gate 15 made of a p-well generally coupled to a ground potential. In the P-type-substrate-based structure as shown in this example, a p+ region 16 (n+ region in the case of an N-type-substrate-based structure) for fixing the substrate potential is formed, and is coupled to the ground potential (the power supply potential in the case of the N-type substrate-based structure).

As described above, the p-well back-gate potential 15 and the P-type-substrate potential 16 are both coupled to the ground potential. Thus, the back-gate potential and the P-type-substrate potential are generally coupled to the common ground in the twin-well-process-based structure as shown in FIG. 1A. In such a twin-well-process-based structure, however, there is a problem that the noise generated by a through current flowing through the inductance component of the package and the transistors propagates directly to the P-type substrate. Because of this, the twin-well-process-based structure is rarely used for an analog circuit sensitive to noise, and is generally used for a digital circuit.

In the case of the triple-well-process-based structure shown in FIG. 1B, on the other hand, an n-well is additionally formed beneath the p-well 14. The purpose is to separate the p+ region constituting the back gate 15 of the transistor and the P-type substrates 10 from each other by use of the added n-well, thereby reducing the propagation of noise from the P-type substrate 10 to the transistor. To this end, the p+ region constituting the back gate 15 of the transistor and the P-type substrate 10 are coupled to separate potentials, respectively. Since the n-well 17 is an n+ region, further, an n+ region 18 is formed and coupled to the power supply potential. With this provision, it is possible to reduce the propagation of noise to the transistor, which has resulted in the widespread use of the triple well process in analog circuits.

Higher speed and higher integration are required for circuits today. With such demands, it is becoming more and more difficult to reduce the influence of noise, especially high-frequency noise, in semiconductor integrated circuits having the triple-well structure. This is because there are parasitic capacitances C1 and C2 generated by a PN junction between a p region and an n region. Such parasitic capacitance may bring about a detrimental effect when an analog circuit based on the triple-well structure and a digital circuit based on the twin-well structure are present on the same substrate. For example, noise caused by a clock signal may propagate from a digital circuit having the twin-well structure to the P-type substrate, and may further propagate from the P-type substrate to an analog circuit having the triple-well structure via the parasitic capacitance. The influence of such cross-talk noise may bring about the deterioration of accuracy in the analog circuit. Such influence is especially noticeable when there is large ringing in the power supply potential due to the inductance of the package and the power supply current of the digital circuit.

Related-art technologies for suppressing the influence of such noise include a method of suppressing the propagation of noise by forming all the circuits by use of the triple-well structure. Another method is to reduce a contact resistance by providing as many contacts as possible for the substrate and wells, thereby strengthening couplings with the power supply potential and the ground. Another method is to provide a guard ring having the function to absorb noise between circuits, thereby reducing the influence of noise. In this manner, there are many technologies available for suppressing the influence of noise in the power supply (i.e., well potential) or the substrate by use of a preventative measure that removes the cause of noise generation and/or noise propagation (e.g., Patent Document 1 an Patent Document 2). However, there are few technologies available for reducing the generated noise by use of a measure that copes with the generated noise.

FIG. 2 is a block diagram showing an example of the construction of a circuit that reduces generated noise (Patent Document 3). The noise reduction circuit shown here is formed on an integrated circuit 6 which includes a noise source circuit 4 and a circuit 5 subject to the influence of the noise, and includes a noise detecting unit 1, a noise offset signal receiving unit 2, and a noise offset signal generating circuit 3. The noise offset signal generating circuit 3 is implemented by use of an inverted amplifier circuit, and compares the substrate potential with an internal or external stable ground potential, thereby performing feedback control by use of the amplifier such as to eliminate the potential difference. In this manner, the output potential of the inverted amplifier circuit is forced to set to the ground potential. This output potential is coupled to the substrate potential to reduce substrate noise.

[Patent Document 1] Patent Application Publication No. 2000-208708

[Patent Document 2] Patent Application Publication No. 2001-28423

[Patent Document 3] Patent Application Publication No. 8-84061

The circuit shown in FIG. 2 operates based on the current noise condition detected by the noise detecting unit 1, and needs to be designed such as to provide a noise reducing effect with respect to all high-frequency noises across the entire range. Further, since the output of the inverted amplifier circuit of the noise offset signal generating circuit 3 is set to the substrate potential (ground potential), the operating range of the circuit is near the ground potential. Because of this problem of high-frequency characteristics and the problem of the operating range, there is a limit to this circuit as to its noise reduction effect.

Accordingly, there is a need for a semiconductor integrated circuit provided with a noise reduction circuit that can effectively reduce noise generated in the substrate and power supply.

SUMMARY OF THE INVENTION

It is a general object of the present invention to provide a semiconductor integrated circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages in accordance with the purpose of the invention, the invention provides a semiconductor integrated circuit which includes a substrate, a digital circuit formed on a triple well formed in the substrate, a first node configured to supply a well potential of the digital circuit, a second node separate from the first node, and a substrate-potential supplying circuit, formed on the substrate, having an input node to receive an input potential from the second node and an output node to supply a substrate potential to the substrate, the substrate-potential supplying circuit having no direct-current path into which a direct current substantially flows through the input node, and configured to generate at the output node an output potential following the input potential.

According to at least one embodiment of the invention, the well potential of the digital circuit and the substrate potential are separated, thereby cutting a direct-current noise component propagating to the substrate. Further, the substrate-potential supplying circuit for generating the output potential following the input potential is provided with a stable input potential that is independent of the well potential of the digital circuit, thereby stabilizing the output potential serving as the substrate potential following the input potential. This provision makes it possible to stabilize the substrate potential even when the digital circuit generates a high-frequency noise.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 3:
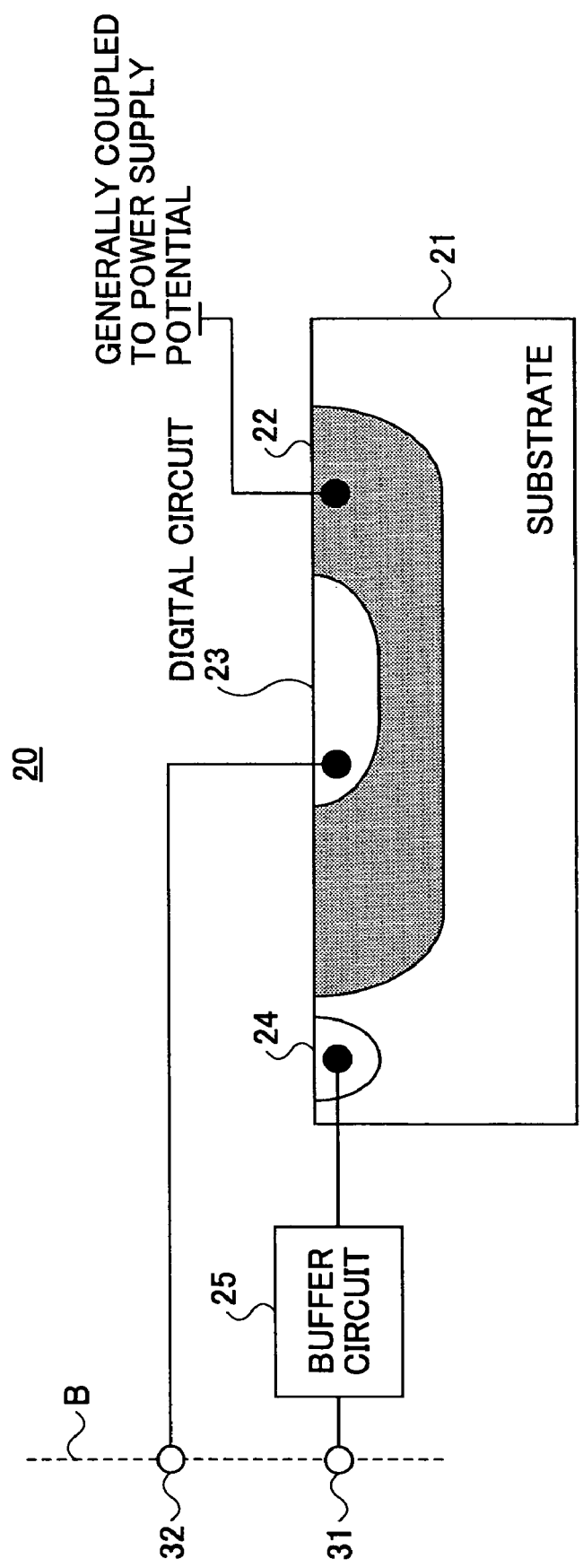
FIG. 3 is an illustrative drawing showing the first embodiment of a semiconductor integrated circuit to which a noise reduction circuit according to the present invention is applied.

FIG. 3 is an illustrative drawing showing the first embodiment of a semiconductor integrated circuit to which a noise reduction circuit according to the present invention is applied. A semiconductor integrated circuit 20 of FIG. 3 includes a substrate 21, a triple well 22, a digital circuit 23, a power supply input part 24 which is a well having the same conduction type as the substrate 21, and a buffer circuit (substrate potential supply circuit) 25. The buffer circuit (substrate potential supply circuit) 25 receives a first predetermined potential from a node 31 as an input potential, and outputs a second predetermined potential as an output potential. The buffer circuit 25 is provided with such function that the input side for receiving the input potential does not have a direct-current path, with no substantial direct current flowing into the input side, and that the output potential generated at the output side follows the input potential. Here, the input node having no direct current path is a gate node of a transistor, for example. The output potential of the buffer circuit (substrate potential supply circuit) 25 is supplied to the substrate 21 as a substrate potential through the power supply input part 24. For the sake of convenience of illustration, the buffer circuit 25 is shown as an element separate from the substrate. In actuality, however, the buffer circuit 25 is formed on the same substrate 21 on which the digital circuit 23 is formed.

The well potential of the digital circuit 23 acting as a noise source is supplied from a node 32. The digital circuit 23 and the substrate 21 are separated from each other by the triple well 22, and the potential of the well constituting the digital circuit 23 and the potential of the substrate 21 are provided from separate power supply units or provided as separate potentials. The node 31 and node 32 are separate nodes at the chip boundary B of the semiconductor integrated circuit, for example, so that the noise generated in the digital circuit 23 does not flow into the buffer circuit 25 from the node 31 through the power supply coupling.

With the provision that separates the well of the digital circuit 23 from the potential of the substrate 21, it is possible to cut the direct noise component propagating to the substrate 21. Further, with the stable potential independent of the well potential of the digital circuit 23 being input into the buffer circuit 25, it is possible to stabilize the output potential of the buffer circuit 25 which follows the input potential, thereby stabilizing the potential of the substrate 21.

According to the structure as described above, the propagation of noise to an analog circuit through the substrate 21 can be reduced in the case in which the analog circuit is formed on the substrate 21 by use of a triple well separate from the triple well 22 of digital circuit 23, or even in the case in which the analog circuit is directly formed on the substrate 21. In this manner, the noise reduction circuit according to the present invention is applicable to various types of analog-and-digital-mixed circuits having various configurations.

Figure 4:
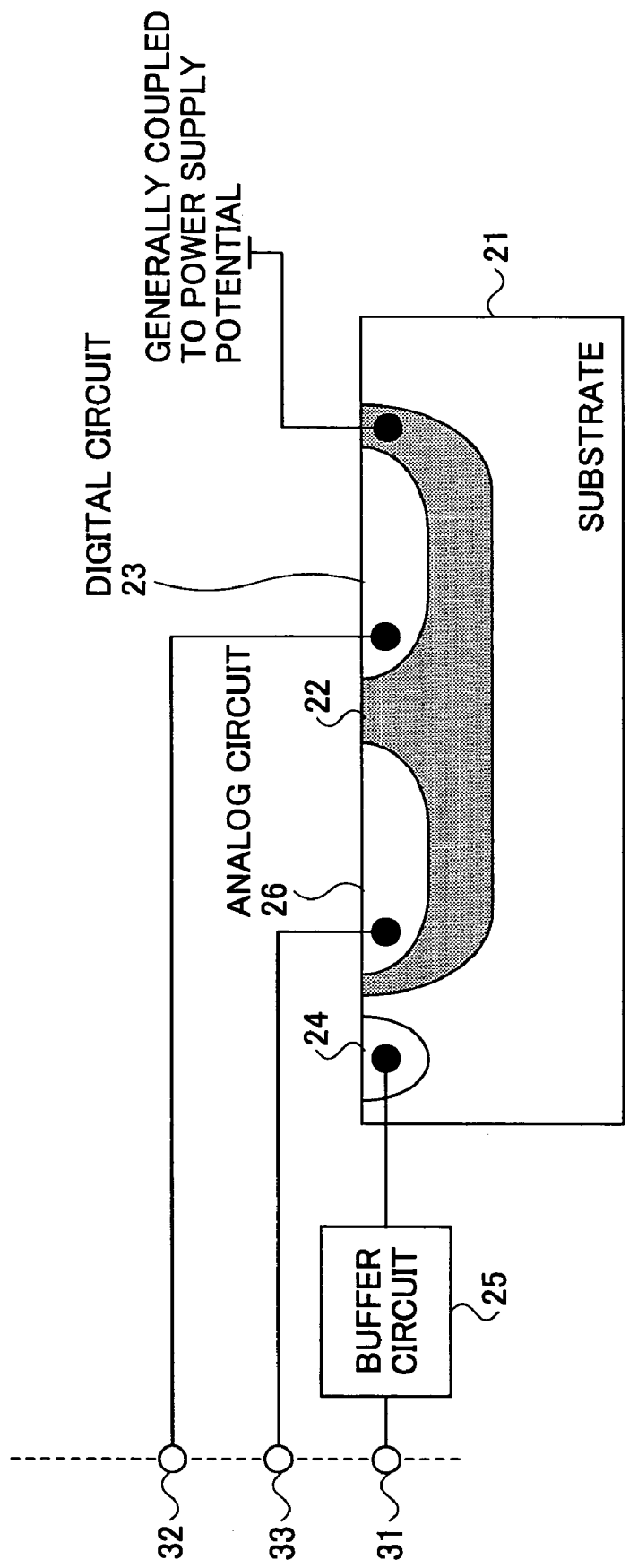
FIG. 4 is an illustrative drawing showing a case in which an analog circuit is formed in the same triple well as the digital circuit is formed.

FIG. 4 is an illustrative drawing showing a case in which an analog circuit is formed in the same triple well 22 as is the digital circuit. The well of the analog circuit 26 receives an independent potential from a node 33 that is separate from the node 31 and the node 32. Further, since a stable potential independent of the well potential of the digital circuit 23 is input into the buffer circuit 25, the potential of the substrate 21 can be stabilized in the same manner as in the case of FIG. 3.

Figure 5:
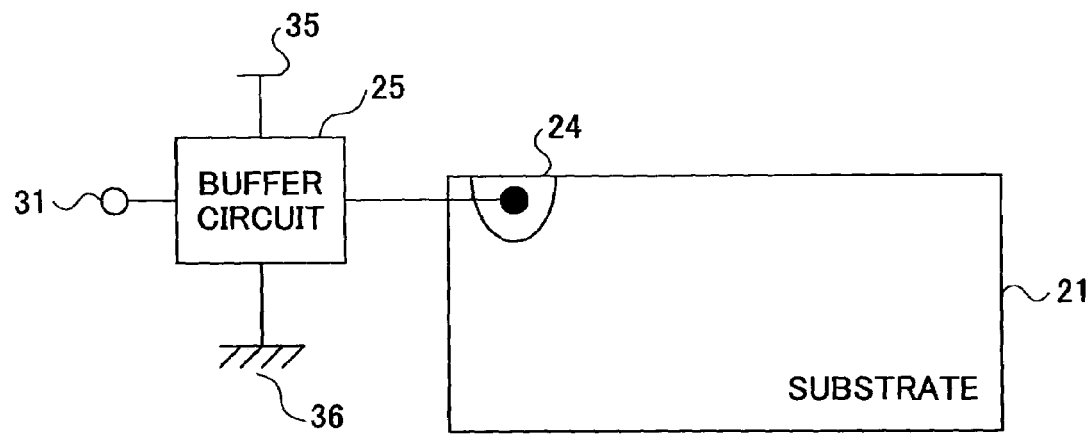
FIG. 5 is an illustrative drawing showing a case in which the power supply and ground of a buffer circuit are provided as an independent power supply and ground.

FIG. 5 is an illustrative drawing showing a case in which the power supply and ground of the buffer circuit 25 are provided as an independent power supply and ground. In FIG. 5, a power supply potential is supplied to the buffer circuit 25 from a power supply terminal 35, and a ground potential is supplied from a ground terminal 36. The power supply terminal 35 and the ground terminal 36 are separate from the terminals for supplying power supply and ground potentials to a digital circuit (e.g., the digital circuit 23 of FIG. 3 or FIG. 4). Such separate structure makes it possible to stabilize the output potential of the buffer circuit 25, thereby further improving the stability of the potential of the substrate 21.

Figure 6:
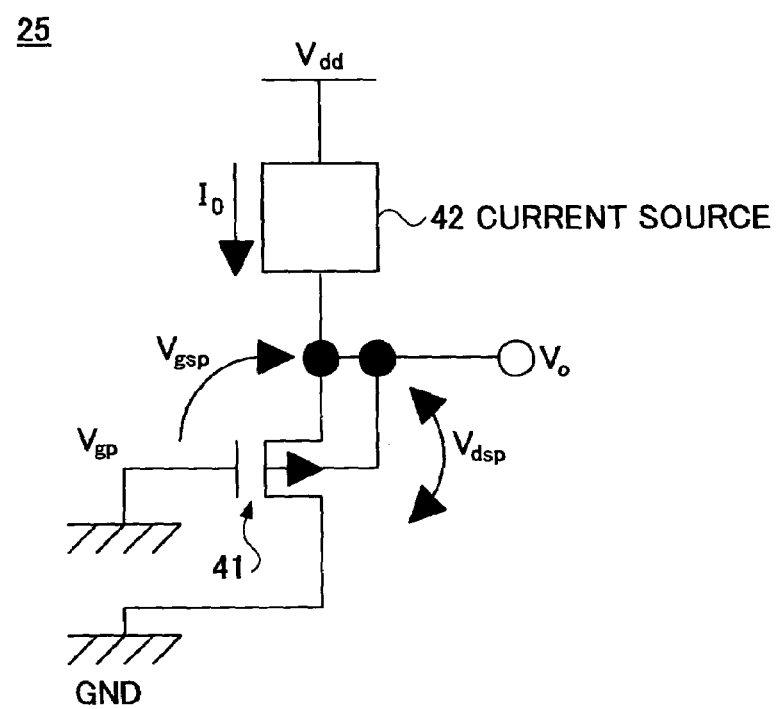
FIG. 6 is a circuit diagram showing the construction of a first embodiment of the buffer circuit.

FIG. 6 is a circuit diagram showing the construction of a first embodiment of the buffer circuit 25. The buffer circuit 25 shown in FIG. 6 is applied to the construction in which the substrate 21 is a P-type substrate. The buffer circuit 25 of FIG. 6 includes a PMOS transistor 41 and a current source 42. In respect of the PMOS transistor 41, the gate node is coupled to a ground node having a potential Vgp, and the drain node is coupled to a ground node GND, with the source node and back gate coupled to an output Vo. The output Vo is supplied to the substrate 21 through the power supply input part 24 (see FIG. 3 and FIG. 4). The current source 42 may be a register, a transistor, a diode, etc.

A voltage between the gate and source of the PMOS transistor 41 is denoted as Vgsp (=Vo−Vgp), and its threshold is denoted as Vtp0 (in the case where a voltage Vsb between the source and the back gate is 0 V). Then, a current Idsp flowing through the PMOS transistor 41 and a current $I_0$ of the current source 42 are represented by using an expression for the transistor's saturation region as:

$$Idsp=I_0=(\beta/2)(Vgsp-Vtp0)^2 \quad (1)$$

where β is μCoxW/L (μ: the mobility of the carrier, Cox: the capacitance of an oxidized film per unit area, W and L: channel width and channel length of the transistor, respectively). Here, the transistor size and the current $I_0$ need to be designed such that the condition |Vdsp|=|Vgsp|>|Vgsp−Vtp0|>0 for allowing the PMOS transistor to operate in the saturation region is satisfied.

By transforming the expression (1), Vgsp is represented as:

$$Vgsp=(2I_0/\beta)^{1/2}+Vtp0 \quad (2)$$

When the above-identified condition is satisfied, $I_0$ supplied from the current source is constant, and β and the threshold voltage Vtp0 can be regarded as constants for a transistor of fixed size. As a result, Vgsp becomes a fixed voltage. Since Vo is equal to Vgp+Vgsp, the output potential Vo follows the input potential Vgp. In order to stabilize Vo, therefore, all that is necessary is to stabilize Vgp. In the construction of FIG. 6, Vgp is fixed to the ground potential, resulting in Vo=Vgsp. The output Vo is thus always set to Vgsp. If the ground potential coupled to Vgp is supplied through a separate node free from noise as shown in FIG. 3 or the like, the noise reducing effect can be further improved.

In the following, a description will be given of a case in which the potential Vo of the P-type substrate changes to Vo±ΔV, taking into account the noise transmitted to the substrate through parasitic capacitance between wells.

A change from Vo to Vo+ΔV means that a change from Vgsp to Vgsp+ΔV is going to take place. Since the PMOS transistor 41 can operate in such a manner as to satisfy |Vdsp|=|Vgsp+ΔV|>|Vgsp+ΔV−Vtp0|>0, an operation in the saturation region is achieved. The operation thus conforms to the expression (2), so that a change from Vgsp+ΔV to Vgsp with a sudden change of ΔV to zero occurs.

When a change from Vo to Vo−ΔV occurs (i.e., when the direction of a potential change is toward a smaller Vo), on the other hand, the condition |Vdsp|=|Vgsp−ΔV|>|Vgsp−ΔV−Vtp0|>0 may not be satisfied, depending on the size of ΔV. In such a case, the operation of the transistor is conducted in a linear region rather than in the saturation region, so that the expression (2) does not hold. When noise is generated in such a manner as to cause reduction in Vo, thus, the circuit of FIG. 6 may not be able to reduce the noise.

As described above, the use of the buffer circuit 25 shown in FIG. 6 makes it possible to reduce a noise causing an increase in the potential of the P-type substrate. To be specific, a noise causing an increase in the potential of the P-type substrate can be reduced by half (by a factor of ½).

Figure 7:
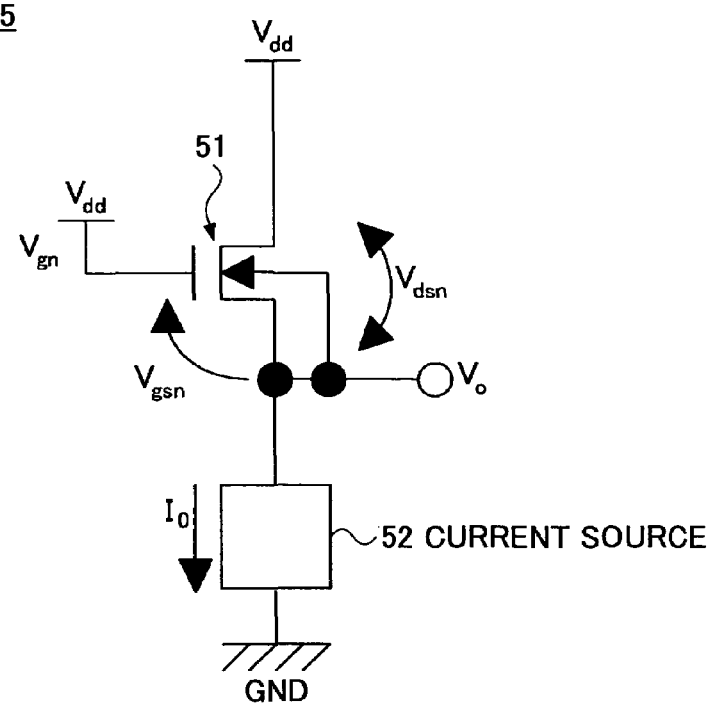
FIG. 7 is a circuit diagram showing the construction of a second embodiment of the buffer circuit.

FIG. 7 is a circuit diagram showing the construction of a second embodiment of the buffer circuit 25. The buffer circuit 25 shown in FIG. 7 is applicable to a configuration in which the substrate 21 is a P-type substrate. The buffer circuit 25 of FIG. 7 includes an NMOS transistor 51 and a current source 52. In respect of the NMOS transistor 51, the gate node is coupled to the power supply node to be set to a potential Vgn, and the drain node is coupled to a power supply node Vdd, with the source node and the back gate being coupled to the output Vo. The output Vo is supplied to the substrate 21 through the power supply input part 24 (see FIG. 3 and FIG. 4). The current source 52 may be a register, a transistor, a diode, etc.

As in the first embodiment shown in FIG. 6, a current flowing through the NMOS transistor 51 is denoted as Idsn, a current of the current source 52 denoted as $I_0$, a voltage between the gate and source of the NMOS transistor 52 denoted as Vgsn (=Vgn−Vo), and its threshold denoted as Vtn0 (in the case where a voltage Vsb between the source and the back gate is 0 V). Then, the following expression is obtained.

$$Idsn=I_0=(\beta/2)(Vgsn-Vtn0)^2 \quad (3)$$

The expression (3) holds when the condition Vdsn=Vgsn>Vgsn−Vtn0>0 is satisfied.

By transforming the expression (3), Vgsn is represented as:

$$Vgsn=(2I_0/\beta)^{1/2}+Vtn0 \quad (4)$$

When the above-identified condition is satisfied, $I_0$ supplied from the current source is constant, and β and the threshold voltage VtnO can be regarded as constants for a transistor of fixed size. As a result, Vgsn becomes a fixed voltage. Since Vo is equal to Vgn−Vgsn, the output potential Vo follows the input potential Vgn. In order to stabilize Vo, therefore, all that is necessary is to stabilize Vgn. In the construction of FIG. 7, Vgn is fixed to the power supply potential, resulting in Vo=Vdd−Vgsn. If the power supply potential coupled to Vgn is supplied through a separate node free from noise as shown in FIG. 3 or the like, the noise reducing effect can be further improved.

In the following, a description will be given of a case in which the potential Vo of the P-type substrate changes to Vo±ΔV, taking into account the noise transmitted to the substrate through parasitic capacitance between wells as in the first embodiment.

A change from Vo to Vo−ΔV means that a change from Vgsn to Vgsn+ΔV is going to take place. Since the NMOS transistor 51 can operate in such a manner as to satisfy Vdsn=Vgsn+ΔV>Vgsn+ΔV−Vtn0>0, an operation in the saturation region is achieved. The operation thus conforms to the expression (4), so that a change from Vgsn+ΔV to Vgsn with a sudden change of ΔV to zero occurs.

When a change from Vo to Vo+ΔV occurs (i.e., when the direction of a potential change is toward a larger Vo), on the other hand, the condition Vdsn=Vgsn−ΔV>Vgsn−ΔV−Vtn0>0 may not be satisfied, depending on the size of ΔV. In such a case, the operation of the transistor is conducted in a linear region rather than in the saturation region, so that the expression (4) does not hold. When noise is generated in such a manner as to cause an increase in Vo, thus, the circuit of FIG. 7 may not be able to reduce the noise.

As described above, the use of the buffer circuit 25 shown in FIG. 7 makes it possible to reduce a noise causing reduction in the potential of the P-type substrate. To be specific, a noise causing reduction in the potential of the P-type substrate can be reduced by half (by a factor of ½).

Figure 8:
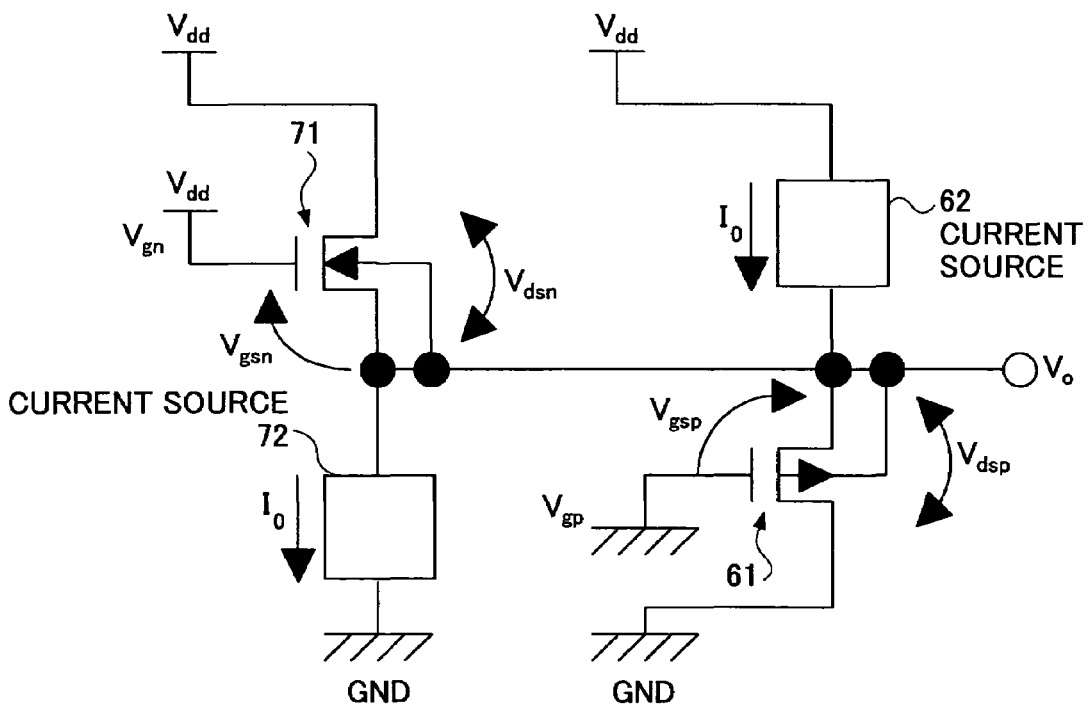
FIG. 8 is a circuit diagram showing the construction of a third embodiment of the buffer circuit.

FIG. 8 is a circuit diagram showing the construction of a third embodiment of the buffer circuit 25. The buffer circuit 25 shown in FIG. 8 is applicable to a configuration in which the substrate 21 is a P-type substrate. The buffer circuit 25 of FIG. 8 includes a PMOS transistor 61, a current source 62, an NMOS transistor 71, and a current source 72. In respect of the NMOS transistor 71, the gate node is coupled to the power supply node to be set to a potential Vgn, and the drain node is coupled to a power supply node Vdd, with the source node and the back gate being coupled to the output Vo. In respect of the PMOS transistor 61, the gate node is coupled to a ground node having a potential Vgp, and the drain node is coupled to a ground node GND, with the source node and back gate coupled to the output Vo. The output Vo is supplied to the substrate 21 through the power supply input part 24 (see FIG. 3 and FIG. 4). Each of the current sources 62 and 72 may be a register, a transistor, a diode, etc.

In this configuration, the potential of the output Vo is controlled such as to attain an equilibrium in which each of the PMOS transistor 61 and the NMOS transistor 71 allows the passage of a current Io. As long as Io is fixed, the output potential Vo is fixed to a constant voltage.

In the following, a description will be given of a case in which the potential Vo of the P-type substrate changes to Vo±ΔV, taking into account the noise transmitted to the substrate through parasitic capacitance between wells.

A change from Vo to Vo+ΔV means that a change from Vgsp to Vgsp+ΔV and a change from Vgsn to Vgsn−ΔV are going to take place. Since the PMOS transistor 61 can operate in such a manner as to satisfy |Vdsp|=|Vgsp+ΔV|>|Vgsp+ΔV−Vtp0|>0, an operation in the saturation region is achieved. The operation thus conforms to the expression (2), so that a change from Vgsp+ΔV to Vgsp with a sudden change of ΔV to zero occurs.

A change from Vo to Vo−ΔV means that a change from Vgsp to Vgsp−ΔV and a change from Vgsn to Vgsn+ΔV are going to take place. Since the NMOS transistor 71 can operate in such a manner as to satisfy Vdsn=Vgsn+ΔV>Vgsn+ΔV−Vtn0>0, an operation in the saturation region is achieved. The operation thus conforms to the expression (4), so that a change from Vgsn+ΔV to Vgsn with a sudden change of ΔV to zero occurs.

In the third embodiment as described above, regardless of whether a change of Vo caused by noise is toward a larger potential or toward a smaller potential, one of the PMOS transistor 61 and the NMOS transistor 71 operates in the saturation region. Because of the operation of the transistor operating in the saturation region to provide the flow of a constant current, the potential of Vo is forcibly fixed. As a result, a feedback operation is achieved such that both the PMOS transistor 61 and the NMOS transistor 71 operate in the saturation region.

As described above, the use of the buffer circuit 25 shown in FIG. 8 makes it possible to effectively reduce a noise component regardless of whether the direction of a change is toward a larger P-type-substrate potential or toward a smaller P-type-substrate potential.

Figure 1A:
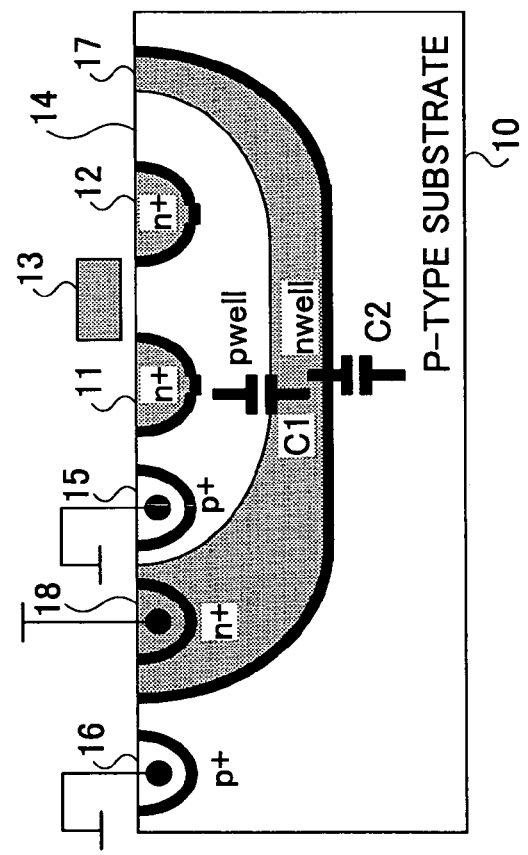
FIGS. 1A and 1B are illustrative drawings showing examples of the structure of a semiconductor integrated circuit using the twin-well/triple-well process in a P-type substrate.
Figure 1B:
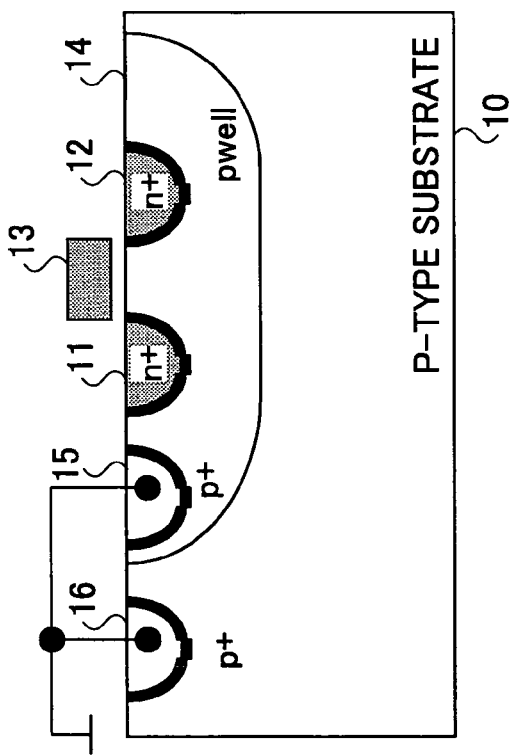
Figure 2:
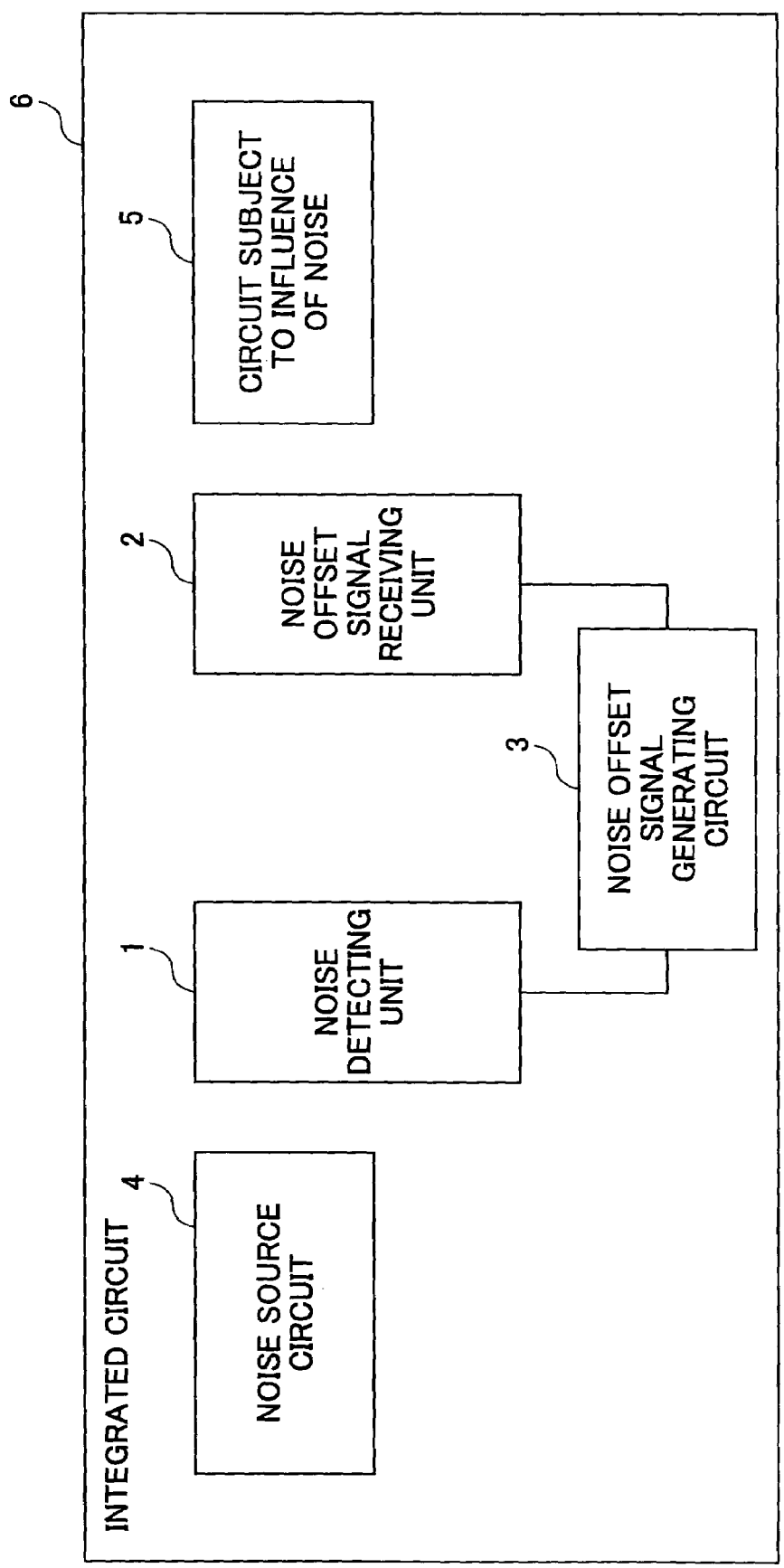
FIG. 2 is a block diagram showing an example of the construction of a circuit that reduces generated noise.
Figure 9:
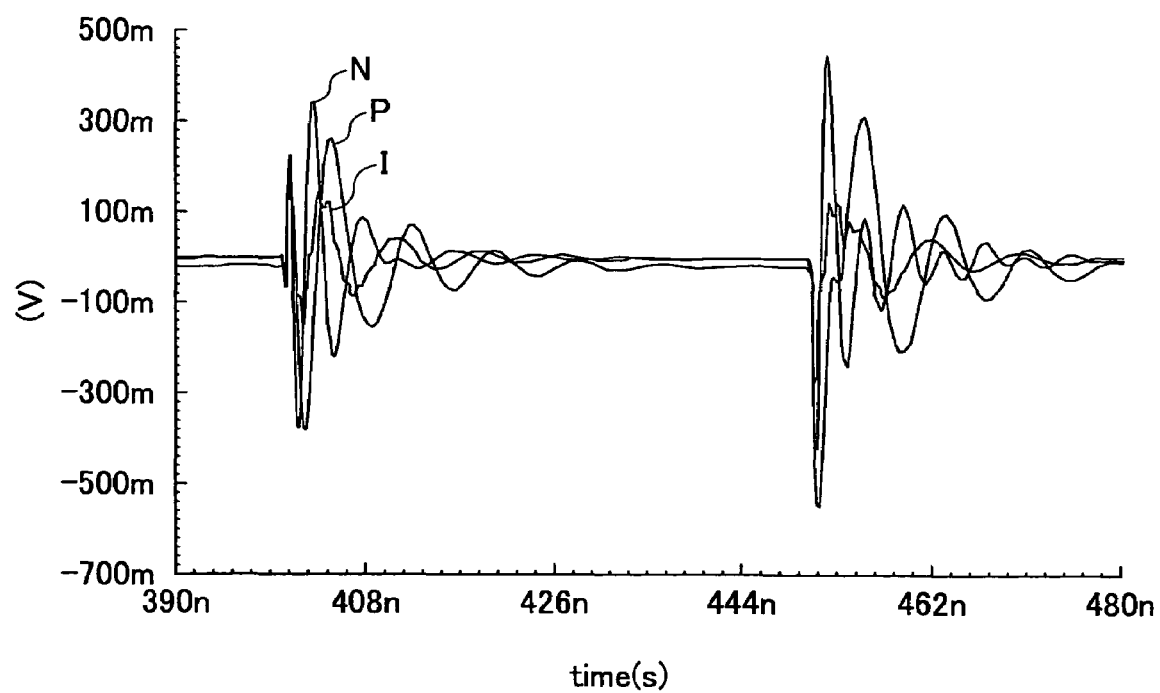
FIG. 9 is a diagram showing simulation waveforms indicative of an effect of the noise reduction circuit according to the present invention.

FIG. 9 is a diagram showing simulation waveforms indicative of an effect of the noise reduction circuit according to the present invention. The horizontal axis represents time, and the vertical axis represents a substrate potential. A waveform I illustrates an effect of the noise reduction circuit using the buffer circuit shown in FIG. 8. This waveform is illustrated with an offset such that its center corresponds to the 0–V mark of the potential shown on the vertical axis. A waveform N corresponds to a case in which no noise reduction circuit is used. A waveform P illustrates an effect of the related-art noise reduction circuit shown in FIG. 2.

In comparison with the waveform N without a noise reduction circuit, the noise components of the waveform I are reduced on both sides, i.e., toward a larger potential and toward a smaller potential. As far as the peak component of the noise is concerned, the use of the noise reduction circuit of the present invention achieves one third to one fourth as large peak size, compared to the use of no noise reduction circuit. Compared with the use of the related-art noise reduction circuit, the noise reduction circuit of the present invention achieves half as large a peak noise component, which is a manifestation of high-frequency noise components.

The reason why the noise reduction circuit of the present invention can reduce noise effectively is, among other reasons, that the substrate potential can be set to an optimum potential suitable for reducing the noise, and also that the circuit can operate in a suitable operating range. Those reasons contribute to the reduction of high-frequency noise components as manifested by the reduction of the noise peak.

In the above embodiments of the present invention, the noise reduction circuit has been described with reference to an example in which a P-type substrate is used. The noise reduction circuit of the present invention is not limited to application to the P-type substrate, and is equally applicable to an N-type substrate. Further, the nose reduction circuit of the present invention may be used to stabilize the potential of a p-well or an n-well.

Further, a noise reducing effect can be further enhanced by providing dedicated pins for the purpose of preventing noise from affecting power supply nodes or potentials input into the noise reduction circuit.

Further, the present invention utilizes the operation principle that the output potential is stabilized by letting a constant current flow, thereby readily achieving a noise reduction circuit never deviating from a suitable operating range by use of a simple circuit structure. Since the circuit can be easily made in a small size, the noise reducing effect can be further enhanced by providing as many noise reduction circuits as necessary in the circuit block where a significant amount of noise is generated.

Further, the present invention is not limited to these embodiments, but various variations and modifications may be made without departing from the scope of the present invention.

What is claimed is:

1. A semiconductor integrated circuit, comprising: a substrate;
    a digital circuit formed on a triple well formed in said substrate;
    a first node configured to supply a well potential of said digital circuit;
    a second node separate from said first node; and
    a substrate-potential supplying circuit, formed on said substrate, having an input node to receive an input potential from said second node and an output node to stabilize a substrate potential of said substrate, said substrate-potential supplying circuit having no direct-current path into which a direct current substantially flows through said input node, and configured to generate at said output node an output potential following the input potential.

2. The semiconductor integrated circuit as claimed in claim 1, further comprising an analog circuit formed in said substrate, wherein a well potential of said analog circuit is independent of the well potential of said digital circuit.

3. The semiconductor integrated circuit as claimed in claim 2, wherein said analog circuit is formed on a triple well that is formed in said substrate separately from the triple well on which said digital circuit is formed.

4. The semiconductor integrated circuit as claimed in claim 2, wherein said analog circuit is directly formed in said substrate.

5. The semiconductor integrated circuit as claimed in claim 2, wherein said analog circuit is formed on the triple well.

6. The semiconductor integrated circuit as claimed in claim 1, wherein a power supply potential and ground potential of said substrate-potential supplying circuit are independent of a power supply potential and ground potential of said digital circuit.

7. A semiconductor integrated circuit, comprising:
    a substrate;
    a digital circuit formed on a triple well formed in said substrate;
    a first node configured to supply a well potential of said digital circuit;
    a second node separate from said first node; and
    a substrate-potential supplying circuit, formed on said substrate, having an input node to receive an input potential from said second node and an output node to supply a substrate potential to said substrate, said substrate-potential supplying circuit having no direct-current path into which a direct current substantially flows through said input node, and configured to generate at said output node an output potential following the input potential, wherein said substrate-potential supplying circuit includes:
    a PMOS transistor having a gate node thereof coupled to said input node, a drain node thereof coupled to a ground potential, and a source node and back gate thereof coupled to said output node; and
    a current source coupled to said source node.

8. The semiconductor integrated circuit as claimed in claim 1, wherein said substrate-potential supplying circuit includes:
    an NMOS transistor having a gate node thereof coupled to said input node, a drain node thereof coupled to a power-supply potential, and a source node and back gate thereof coupled to said output node; and
    a current source coupled to said source node.

9. A semiconductor integrated circuit, comprising:
    a substrate;
    a digital circuit formed on a triple well formed in said substrate;
    a first node configured to supply a well potential of said digital circuit;
    a second node separate from said first node; and
    a substrate-potential supplying circuit, formed on said substrate, having an input node to receive an input potential from said second node and an output node to supply a substrate potential to said substrate, said substrate-potential supplying circuit having no direct-current path into which a direct current substantially flows through said input node, and configured to generate at said output node an output potential following the input potential, wherein said substrate-potential supplying circuit includes:
    a PMOS transistor having a gate node thereof coupled to said input node, a drain node thereof coupled to a ground potential, and a source node and back gate thereof coupled to said output node;
    a current source coupled to said source node of said PMOS transistor;
    an NMOS transistor having a gate node thereof coupled to said input node, a drain node thereof coupled to a power-supply potential, and a source node and back gate thereof coupled to said output node; and
    a current source coupled to said source node of said NMOS transistor.

10. A semiconductor integrated circuit, comprising:
    a substrate;
    a digital circuit formed on a triple well formed in said substrate;
    a first node configured to supply a well potential of said digital circuit;
    a second node separate from said first node; and
    a substrate-potential supplying circuit, formed on said substrate, having an input node to receive an input potential from said second node and an output node to supply a substrate potential to said substrate, said substrate-potential supplying circuit having no direct-current path into which a direct current substantially flows through said input node, and configured to generate at said output node an output potential following the input potential, wherein said substrate-potential supplying circuit includes:
    a transistor having a gate note thereof coupled to said input node and a source node thereof coupled to said output node; and
    a current source adapted to supply a current to said transistor.

* * * * *